US008525555B2

(12) United States Patent
Kondo et al.

(10) Patent No.: US 8,525,555 B2
(45) Date of Patent: Sep. 3, 2013

(54) POWER DETECTOR

(71) Applicant: Panasonic Corporation, Osaka (JP)

(72) Inventors: Kazuhiro Kondo, Tokushima (JP); Katsuhiko Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/708,501

(22) Filed: Dec. 7, 2012

(65) Prior Publication Data

US 2013/0099826 A1    Apr. 25, 2013

Related U.S. Application Data

(63) Continuation of application No. PCT/JP2010/007174, filed on Dec. 9, 2010.

(30) Foreign Application Priority Data

Jun. 9, 2010   (JP) .................................. 2010-132472

(51) Int. Cl.
*H03K 99/00*    (2013.01)
(52) U.S. Cl.
USPC .................................. 327/89; 327/74; 327/77
(58) Field of Classification Search
USPC ............................................. 327/89, 74, 77
See application file for complete search history.

(56) References Cited

U.S. PATENT DOCUMENTS

| | | | |
|---|---|---|---|
| 8,193,836 B2* | 6/2012 | Nguyen et al. | 327/73 |
| 2004/0184910 A1* | 9/2004 | Busch | 415/13 |
| 2008/0012604 A1 | 1/2008 | Morishita et al. | |
| 2010/0090730 A1* | 4/2010 | Wu | 327/143 |
| 2010/0156470 A1* | 6/2010 | Maltione et al. | 327/77 |
| 2011/0062996 A1* | 3/2011 | Chang et al. | 327/77 |

FOREIGN PATENT DOCUMENTS

| | | |
|---|---|---|
| JP | 08-125521 A | 5/1996 |
| JP | 2004-172796 A | 6/2004 |

OTHER PUBLICATIONS

International Search Report mailed Feb. 15, 2011 issued in corresponding International Application No. PCT/JP2010/007174.

* cited by examiner

*Primary Examiner* — Long Nguyen
*Assistant Examiner* — Patrick Chen
(74) *Attorney, Agent, or Firm* — McDermott Will & Emery LLP

(57) ABSTRACT

In a power detector, a comparator for detection receives an input signal and a reference voltage, and compares the input signal to the reference voltage around the switching time of active and inactive states of the output of the comparator in accordance with an output of an input switching signal generator. Except for the switching time, an input voltage for non-use of the comparator is inputs to the comparator for detection, and the differential inputs are fixed to the same potential. Therefore, aging reduction in the accuracy of power detection caused by BT degradation is effectively mitigated.

6 Claims, 10 Drawing Sheets

POWER DETECTOR

CROSS-REFERENCE TO RELATED APPLICATION

This is a continuation of PCT International Application PCT/JP2010/007174 filed on Dec. 9, 2010, which claims priority to Japanese Patent Application No. 2010-132472 filed on Jun. 9, 2010. The disclosures of these applications including the specifications, the drawings, and the claims are hereby incorporated by reference in their entirety.

BACKGROUND

The present disclosure relates to power detectors detecting power and outputting signals.

In general, a power detector detecting power based on a predetermined voltage is used as a reset signal generator for a calculator in a semiconductor integrated circuit. When a power supply voltage is lower than or equal to a predetermined voltage Vo, a power detection signal, which indicates that power is undetected, is generally output to stop the calculator. On the other hand, when the power supply voltage is higher than the predetermined voltage Vo, a power detection signal, which indicates that power is detected, is output to operate the calculator, thereby operating the semiconductor integrated circuit.

The configuration of a power detector will be described.

A power detector includes, as shown in FIG. 8, a power voltage divider 11 and a comparator 14. The power voltage divider 11 linearly divides a power supply voltage using two resistors arranged in series between a power supply terminal and a ground terminal, and outputs a signal of an output voltage 12, which is the voltage at the time of division. The comparator 14 compares the output voltage 12 of the power voltage divider 11 to a reference voltage 13.

The comparator 14 has, for example, a configuration shown in FIG. 10. Specifically, the comparator 14 includes two MOS transistors 20 and 21, which have equal threshold voltages, a current supply 22, and a current minor 23, which is a semiconductor element. In the two MOS transistors 20 and 21, gates are coupled to inputs of the comparator 14, sources are commonly coupled to the current supply 22, and drains are coupled to the current minor 23. A drain 24 of one of the MOS transistors is coupled to an inverter 25. Then, an output 26 of the inverter 25 is the output of the comparator 14. The comparator 14 inverts the output of the inverter 25 when gate voltages of the two MOS transistors 20 and 21 are equal.

The operation of the power detector shown in FIG. 8 will be described.

In FIG. 8, the output voltage 12 of the power voltage divider 11 is a voltage obtained by dividing the power supply voltage with the resistors, and thus changes in proportion to the power supply voltage.

On the other hand, the reference voltage 13 is always fixed to the output voltage 12 of the power voltage divider 11 at the time when the power supply voltage is the predetermined voltage Vo, and is always constant regardless of the power supply voltage.

The comparator 14 receives the output voltage 12 of the power voltage divider 11 and the reference voltage 13, and inverts the power detection signal output from the comparator 14 when the two inputs are equal.

In FIG. 9, based on the comparison result of the comparator 14, when the output voltage 12 of the power voltage divider 11 is lower than or equal to the reference voltage 13, the comparator 14 generally regards the power supply voltage as being lower than or equal to the predetermined voltage Vo, and outputs a power detection signal indicating that the power supply is undetected (a low level in FIG. 9). When the output voltage 12 of the power voltage divider 11 is higher than the reference voltage 13, the comparator 14 regards the power supply voltage as being higher than the predetermined voltage Vo, and outputs a power detection signal 15 indicating that the power supply is detected (a high level in FIG. 9).

In the power detector operating as described above, the comparator 14 receives the voltage 12 changing in proportional to the power supply voltage at one input, and the constant reference voltage 13 at the other input. This causes a difference in bias application between the inputs of the comparator 14.

An MOS transistor has the problem of bias temperature (BT) degradation. BT degradation is fluctuations in the threshold voltage of an MOS transistor caused by applying positive or negative bias to the gate of the MOS transistor. Moreover, it is known that the amount of fluctuations changes depending on the temperature or the time for applying bias.

An MOS transistor, in which BT degradation occurs, influences the characteristics of an analog circuit. For example, the characteristics of the comparator 14 of inverting an output when input voltages are equal are on the assumption that the threshold voltages of the two MOS transistors 20 and 21 are equal.

However, a difference in bias application arises between the inputs of the comparator 14 in the power detector, thereby causing a difference in the amount of fluctuations in the threshold voltages due to BT degradation in the two MOS transistors 20 and 21, of which the gates are coupled to the inputs. This causes a difference in threshold voltage between the two MOS transistors 20 and 21. Thus, the comparator 14 inverts the output when the input signals are not equal, i.e., the predetermined voltage Vo fluctuates, at which a power voltage is to be detected.

Therefore, BT degradation reduces the power detection accuracy of the power detector.

As a known measure against the problem, for example, Japanese Patent Publication No. 2004-172796 (e.g., page 1, FIG. 2, etc.) suggest clamping the gates of MOS transistors to be protected from BT degradation to the same potential as the sources to prevent BT degradation when a circuit is inactive. FIG. 11 illustrates this configuration. In the drawing, MOS transistors 30 and 31 are to be protected from BT degradation. When the circuit is inactive, semiconductor elements 32 and 33 are powered on, and the gates and sources of the MOS transistors 30 and 31 are set to the same potential.

SUMMARY

However, the measure against BT degradation suggested in Japanese Patent Publication No. 2004-172796 is on the assumption that the circuit is inactive, and is thus not applicable to a power detector which always needs to operate.

The present disclosure was made in view of the problem. It is an objective of the present disclosure to provide a power detector, which detects power by comparing an output voltage of a power voltage divider to a reference voltage with a comparator, and outputs a signal, while preventing BT degradation and always enabling operation.

In order to achieve the objective, in the present disclosure, the comparator is divided to the comparator for detection, which detects a predetermined voltage Vo, and an auxiliary comparator, which determines whether a power supply voltage is around the predetermined voltage Vo. Only when the power supply voltage is around the predetermined voltage Vo, the comparator for detection operates. When the power supply voltage is not around the predetermined voltage Vo, a same voltage is applied to two inputs of the comparator for detection.

That is, when the power supply voltage is around the predetermined voltage Vo, the comparator for detection operates. However, the difference in bias application between the two inputs is small, and thus, the difference in fluctuations in the threshold voltages caused by BT degradation is small. Therefore, the accuracy of power detection is less reduced.

On the other hand, when the power supply voltage is not around the predetermined voltage Vo, a same voltage is applied to the two inputs of the comparator for detection, and BT degradation in the two inputs progresses at the same speed. This prevents an increase in the difference in fluctuations in the threshold voltages, and thus the accuracy of power detection does not decrease.

As a result, measures can be taken against BT degradation in a comparator for detection detecting a predetermined voltage Vo, and a power detector can always operate by combining the comparator for detection with an auxiliary comparator.

In general, when input voltages of a comparator are equal, the output is inconstant. In a conventional power detector, however, this phenomenon is hardly problematic, since input voltages of a comparator are equal for a short time. In the power detector according to the present disclosure, the equal voltage is applied to the inputs of the comparator for detection when the power supply voltage is not around the predetermined voltage Vo. Thus, the output of the comparator for detection is inconstant for a long time period. If the indefinite state is transmitted to a power detection signal, an accurate power detection signal cannot be obtained. The power detector according to the present disclosure includes, at a subsequent stage of the comparator for detection, a fixing unit for fixing the output to a constant voltage when the power supply voltage is not around the predetermined voltage Vo.

Specifically, a power detector according to a first aspect of the present disclosure includes a power voltage divider configured to divide a voltage of a power supply; a comparator for detection configured to compare a first output voltage of the power voltage divider to a reference voltage; a higher voltage side auxiliary comparator configured to compare a second output voltage of the power voltage divider, which is higher than the first output voltage, to the reference voltage; a lower voltage side auxiliary comparator configured to compare a third output voltage of the power voltage divider, which is lower than the first output voltage, to the reference voltage; an input switching signal generator configured to generate an input switching signal based on an output of the higher voltage side auxiliary comparator and an output of the lower voltage side auxiliary comparator; an input switch configured to switch inputs of the comparator for detection from the reference voltage and the first output voltage to an input voltage for non-use of the comparator in accordance with the input switching signal; a signal fixing unit configured to fix an output of the comparator for detection to a constant voltage when the input switch selects the input voltage for non-use of the comparator; and a power detection signal generator configured to generate a power detection signal based on the output of the lower voltage side auxiliary comparator and an output of the signal fixing unit.

A power detector according to a second aspect of the present disclosure includes a power voltage divider configured to divide a voltage of a power supply; a comparator for detection configured to compare a first output voltage of the power voltage divider to a reference voltage; a higher voltage side auxiliary comparator configured to compare a second output voltage of the power voltage divider, which is higher than the first output voltage, to the reference voltage; an input switch configured to switch inputs of the comparator for detection from the reference voltage and the first output voltage to an input voltage for non-use of the comparator in accordance with an output of the higher voltage side auxiliary comparator; and a signal fixing unit configured to fix an output of the comparator for detection to a constant voltage when the input switch selects the input voltage for non-use of the comparator.

According to a third aspect of the present disclosure, in the power detector according to the second aspect, the higher voltage side auxiliary comparator may have lower comparison accuracy than the comparator for detection.

According to a fourth aspect of the present disclosure, in the power detector according to the second aspect, the signal fixing unit may be a selector.

According to a fifth aspect of the present disclosure, the power detector according to the second aspect may further include a power breaker configured to break power of the comparator for detection when the input switch selects the input voltage for non-use of the comparator as the input of the comparator for detection.

A power detector according to a sixth aspect of the present disclosure includes a power voltage divider configured to divide a voltage of a power supply; a comparator for detection configured to compare a first output voltage of the power voltage divider to a reference voltage; a lower voltage side auxiliary comparator configured to compare a second output voltage of the power voltage divider, which is lower than the first output voltage, to the reference voltage; an input switch configured to switch inputs of the comparator for detection from the reference voltage and the first output voltage to an input voltage for non-use of the comparator in accordance with an output of the lower voltage side auxiliary comparator; a signal fixing unit configured to fix an output of the comparator for detection to a constant voltage when the input switch selects the input voltage for non-use of the comparator; and a power detection signal generator configured to generate a power detection signal based on the output of the lower voltage side auxiliary comparator and an output of the signal fixing unit.

In the first to sixth aspects of the present disclosure, an increase in the difference in fluctuations in the threshold voltages caused by BT gradation between differential input transistors of a comparator for detection can be mitigated, thereby mitigating reduction in the accuracy of power detection.

In particular, in the third aspect, the area of the higher voltage side auxiliary comparator can be reduced, thereby reducing the area of a circuit. The advantage can be obtained because the accuracy of the auxiliary comparator is not required as much as the accuracy of comparator for detection, while the accuracy of semiconductor devices tends to decrease due to variations in a manufacturing process with reduction in the areas of the semiconductor devices in the circuit.

In the fourth aspect, the signal fixing unit is a selector. An inconstant output of the comparator for detection can be prevented with a relatively small area when the input switch selects the input voltage for non-use of the comparator as the input of the comparator for detection.

In addition, in the fifth aspect, no current flows to the comparator for detection when the input switch selects the input voltage for non-use of the comparator as the input of the comparator for detection, thereby reducing the power consumption.

As described above, the power detector according to the present disclosure has a circuit configuration which fixes differential inputs of the comparator for detection to same potential except for the time around the switching time between the active and inactive states of the output of the comparator for detection. Therefore, the power detector is advantageous in mitigating reduction in the accuracy of power detection caused by BT degradation.

DETAILED DESCRIPTION

Figure 1:
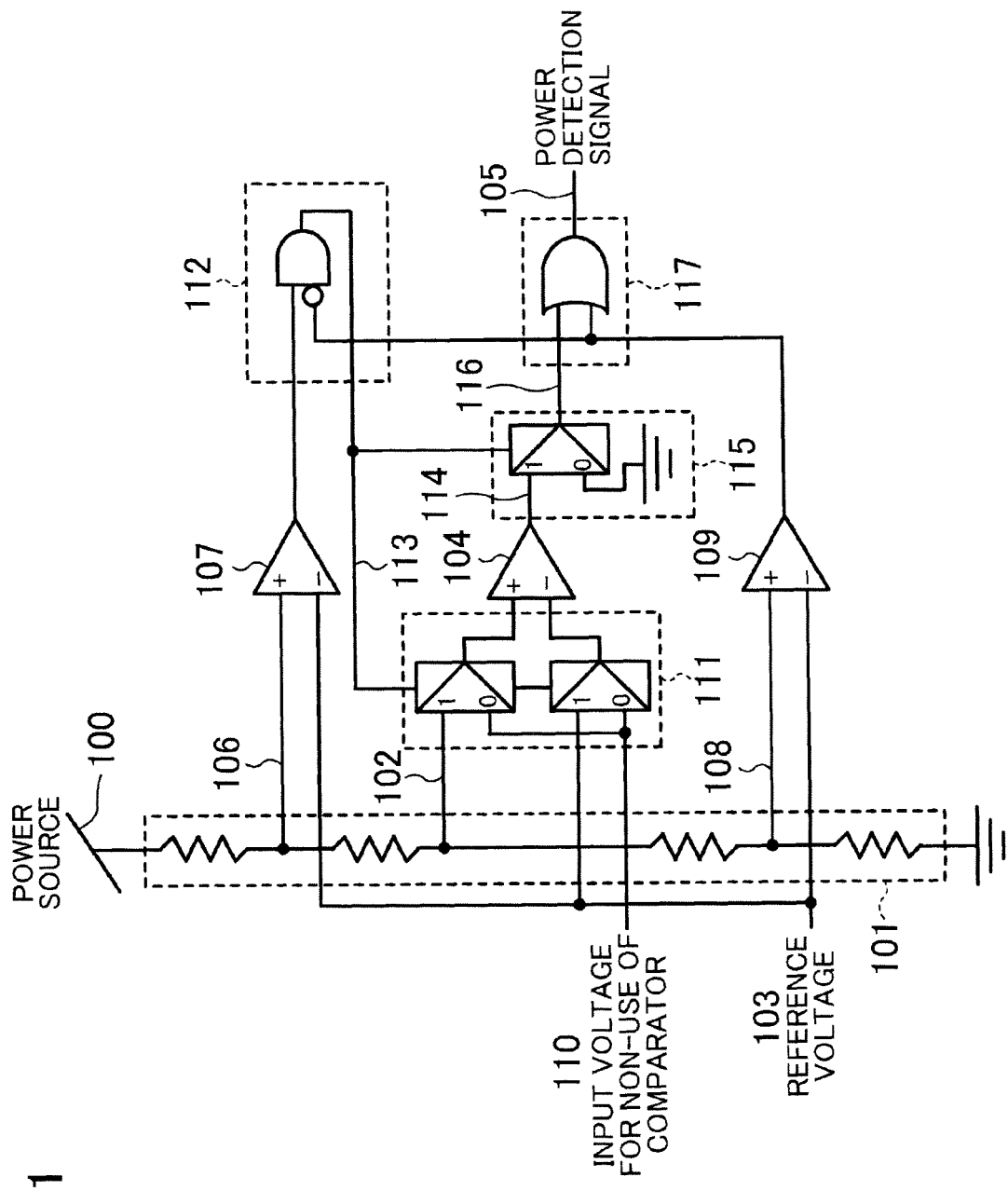
FIG. 1 illustrates a configuration of a power detector according to a first embodiment of the present disclosure.

Embodiments of the present disclosure will be described hereinafter with reference to the drawings. In the embodiments, the same reference characters are used to represent equivalent elements operating similarly, and the repetitive explanation thereof may be omitted.

First Embodiment

FIG. 1 is a circuit diagram of a power detector according to this embodiment. FIGS. 2A-2E illustrate waveforms in the power detector.

In FIG. 1, the power detector includes a power voltage divider 101 dividing the voltage of the power supply 100, a comparator 104 for detection comparing a first output voltage 102 of the power voltage divider 101 to a reference voltage 103, a higher voltage side auxiliary comparator 107 comparing a second output voltage 106 of the power voltage divider 101, which is higher than the first output voltage 102, to the reference voltage 103, and a lower voltage side auxiliary comparator 109 comparing a third output voltage 108 of the power voltage divider 101, which is lower than the first output voltage 102, to the reference voltage 103.

The power detector of FIG. 1 further includes an input switching signal generator (an input switching signal generating means) 112 generating an input switching signal 113 based on an output of the higher voltage side auxiliary comparator 107 and an output of the lower voltage side auxiliary comparator 109, an input switch (an input switching means) 111 switching inputs of the comparator 104 for detection from the combination of the reference voltage 103 and the first output voltage 102 to an input voltage 110 for non-use of the comparator when the input switching signal 113 is inactive, a signal fixing circuit (a signal fixing means) 115 fixing an output of the comparator 104 for detection to a constant voltage when the input switching signal 113 is inactive, and a power detection signal generator (a power detection signal generating means) 117 generating a power detection signal 105 based on the output of the lower voltage side auxiliary comparator 109 and an output of the signal fixing circuit 115.

Then, the detailed configuration and operation of the power detector of FIG. 1 will be described.

The power supply 100 is the power supply to be detected by the power detector. The power voltage divider 101 divides the voltage of the power supply 100 using, for example, a resistor to generate the output voltage 102 to the comparator 104 for detection, the output voltage 106 to the higher voltage side auxiliary comparator 107, and the output voltage 108 to the lower voltage side auxiliary comparator 109.

Figure 2:
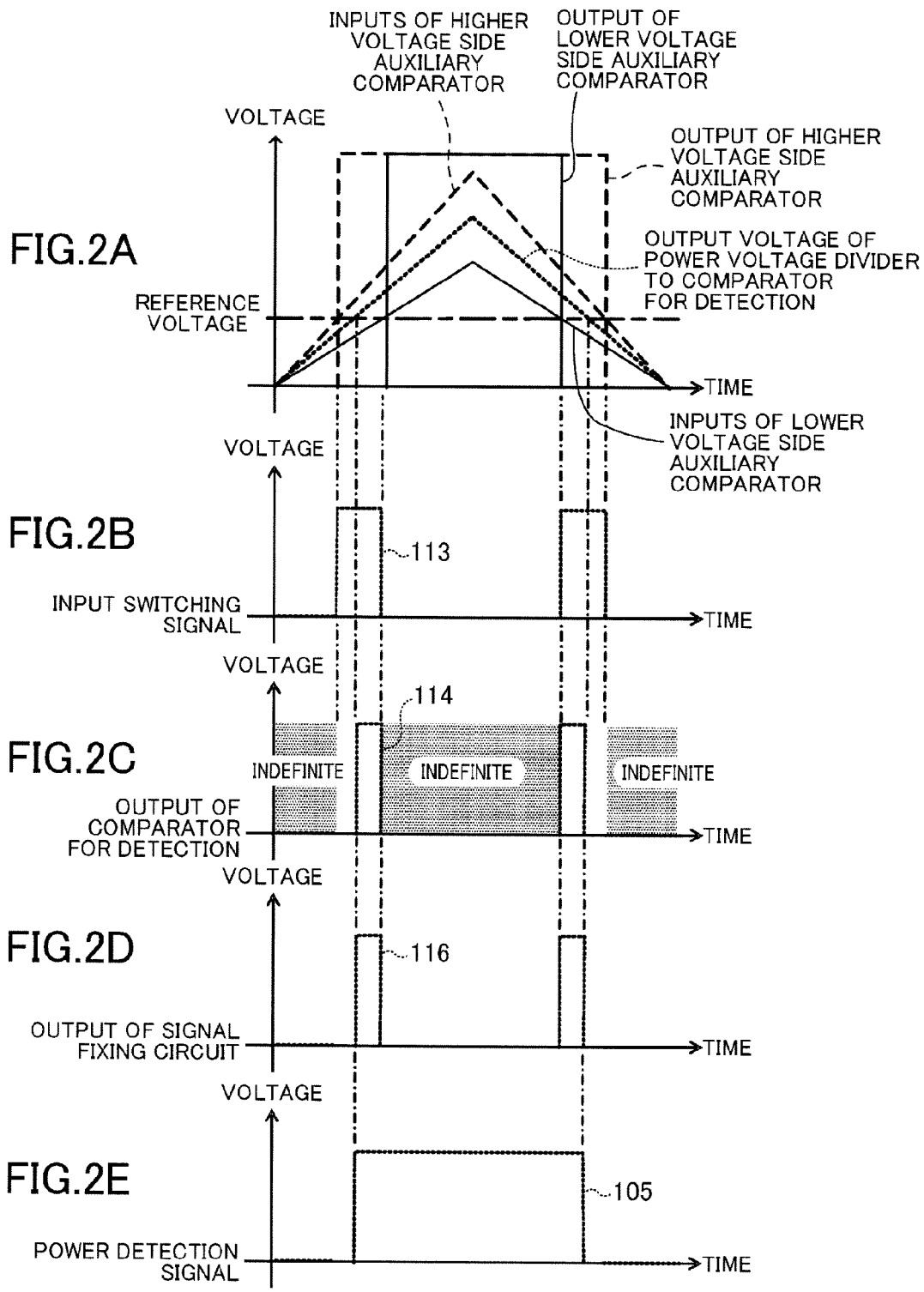
FIG. 2A illustrates a waveform of an output voltage of a power voltage divider to a comparator for detection, waveforms of inputs and an output of a higher voltage side auxiliary comparator, and waveforms of inputs and an output of a lower voltage side auxiliary comparator, in the first embodiment.
FIG. 2B illustrates a waveform of an input switching signal to an input switch.
FIG. 2C illustrates a waveform of an output signal of the comparator for detection.
FIG. 2D illustrates a waveform of an output of a signal fixing circuit.
FIG. 2E illustrates a waveform of a power detection signal.

The comparator 104 for detection receives the output voltage 102 and the reference voltage 103 via the input switch 111, and compares the output voltage 102 to the reference voltage 103 as shown in FIG. 2A. As a result of the comparison, where the output voltage 102 is higher, the comparator 104 for detection activates its output 114.

The higher voltage side auxiliary comparator 107 receives the output voltage 106, and compares the output voltage 106 to the reference voltage 103. As a result of the comparison, where the output voltage 106 is higher, the higher voltage side auxiliary comparator 107 activates its output.

The lower voltage side auxiliary comparator 109 receives the output voltage 108, and compares the output voltage 108 to the reference voltage 103. As a result of the comparison, where the output voltage 108 is higher, the lower voltage side auxiliary comparator 109 activates its output.

The input switching signal generator 112 is, for example, a gate circuit, and performs AND operation of the inverted signal of the output of the lower voltage side auxiliary comparator 109 and the output of the higher voltage side auxiliary comparator 107. Then, the input switching signal generator 112 generates the input switching signal 113 for controlling the input switch 111 as shown in FIG. 2B. The input switch 111 allows the output voltage 102 and the reference voltage 103 to be applied to inputs of the comparator 104 for detection when the input switching signal 113 is active. The input switch 111 allows the input voltage 110 for non-use of the comparator to be applied to the inputs of the comparator 104 for detection when the input switching signal 113 is inactive.

With this operation of the input switch 111, different input voltages are applied to the two inputs of the comparator 104 for detection, only when the output of the higher voltage side auxiliary comparator 107 is active, and the output of the lower voltage side auxiliary comparator 109 is inactive. In this state, the comparator 104 for detection activates its output 114 when the output voltage 102 is higher than the reference voltage 103 as shown in FIG. 2C.

When the output of the higher voltage side auxiliary comparator 107 is inactive, or the output of the lower voltage side auxiliary comparator 109 is active, the input voltage 110 for non-use of the comparator is applied to both of the two inputs of the comparator 104 for detection. In this period, there is no difference in progress of BT degradation between the two inputs of the comparator 104 for detection. If there is no difference in progress of BT degradation between the two inputs, the difference in the amount of variations in the threshold voltage due to the BT degradation between the two inputs does not increase. This mitigates reduction in the accuracy of power detection caused by the BT degradation.

The signal fixing circuit 115 is a selector, which receives the output 114 of the comparator 104 for detection at one input, and a fixed voltage (a ground voltage) at the other input. As shown in FIG. 2D, when the input switch 111 selects the input voltage 110 for non-use of the comparator as the inputs of the comparator 104 for detection, the signal fixing circuit 115 fixes the output of the comparator 104 for detection to the constant voltage (the ground voltage). This prevents an indefinite state output from the comparator 104 for detection from being transmitted to the power detection signal 105 with a relatively small area.

The power detection signal generator 117 performs OR operation of the output of the signal fixing circuit 115 and the output of the lower voltage side auxiliary comparator 109. As shown in FIG. 2E, when the output voltage 102 is higher than the reference voltage 103, the power detection signal 105 is always set high.

As described above, according to this embodiment, the time when different input voltages are applied to the two inputs of the comparator 104 for detection is limited. This mitigates reduction in the accuracy of power detection caused by BT degradation.

While in this embodiment, the output voltage 102 is selected when the input switching signal 113 is active, the output voltage 102 may be selected when the input switching signal 113 is inactive.

Second Embodiment

Figure 3:
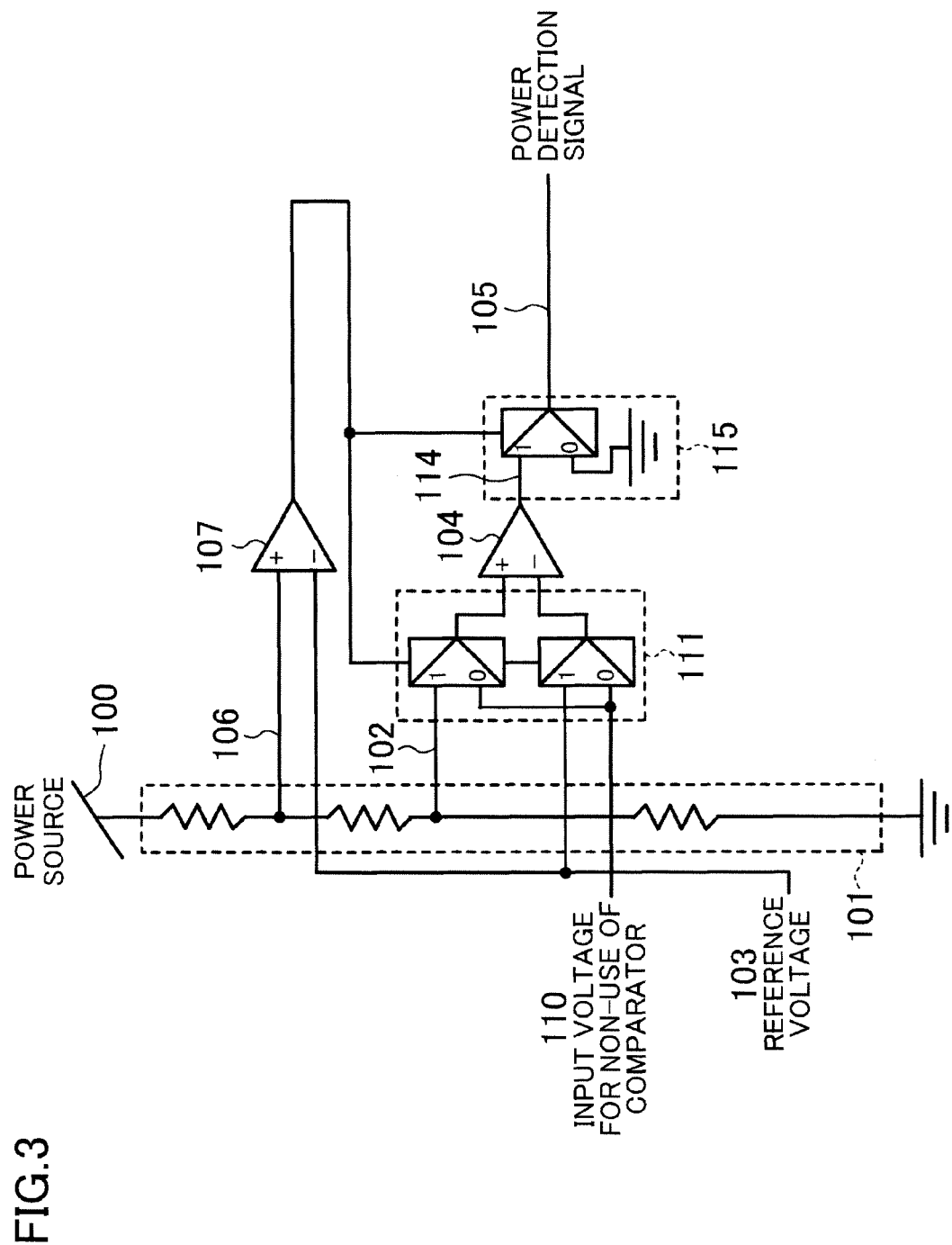
FIG. 3 illustrates a configuration of a power detector according to a second embodiment of the present disclosure.
Figure 4:
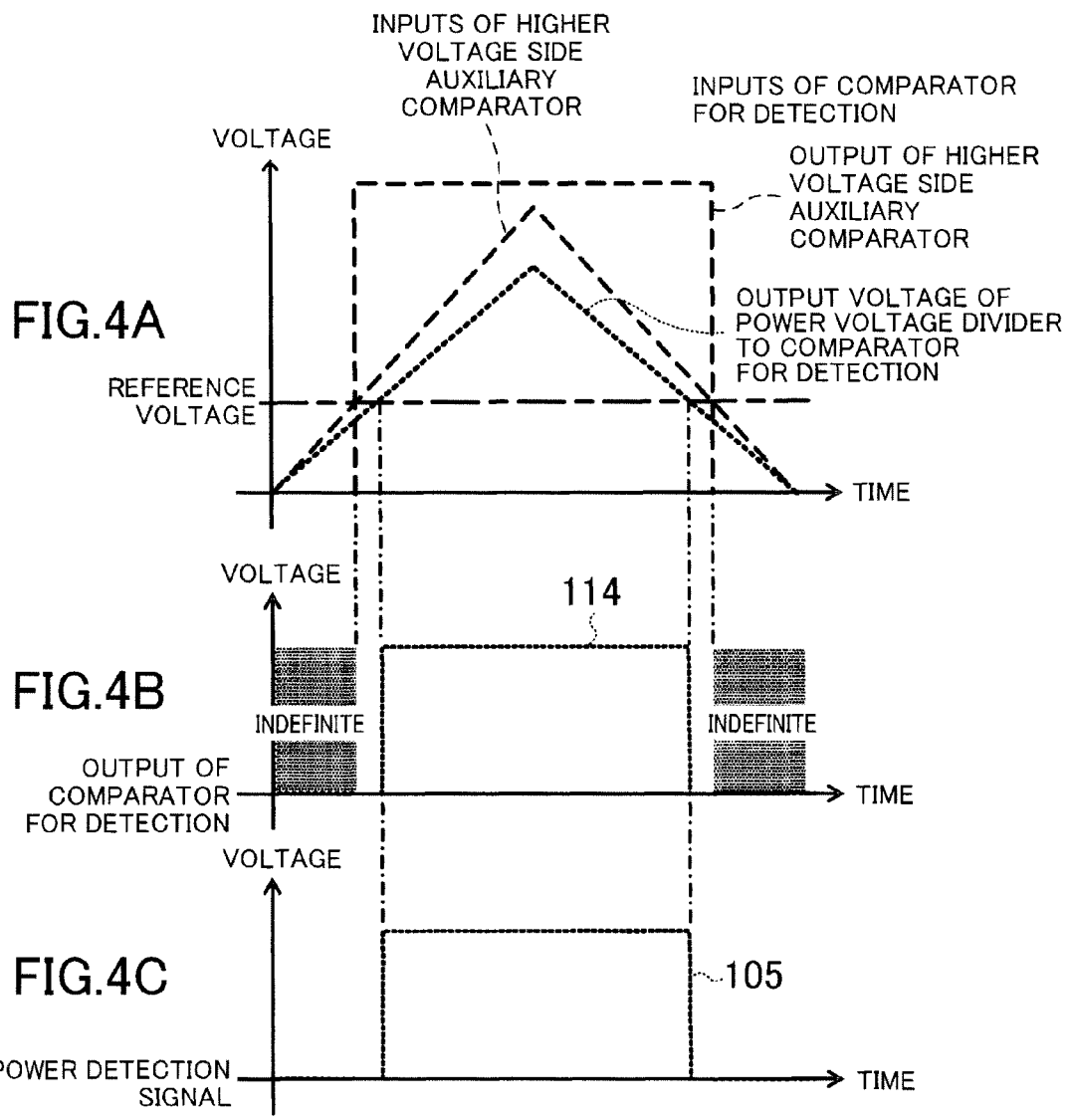
FIG. 4A illustrates a waveform of an output voltage of a power voltage divider to a comparator for detection, and waveforms of inputs and an output of a higher voltage side auxiliary comparator, in the second embodiment.
FIG. 4B illustrates a waveform of an output signal of the comparator for detection.
FIG. 4C illustrates a waveform of a power detection signal.

FIG. 3 is a circuit diagram of a power detector according to this embodiment. FIGS. 4A-4C illustrate waveforms in the power detector.

In FIG. 3, the power detector includes a power voltage divider 101 dividing the voltage of the power supply 100, a comparator 104 for detection comparing a first output voltage 102 of the power voltage divider 101 to a reference voltage 103, and a higher voltage side auxiliary comparator 107 comparing a second output voltage 108 of the power voltage divider 101, which is higher than the first output voltage 102, to the reference voltage 103.

The power detector of FIG. 3 further includes an input switch 111 switching inputs of the comparator 104 for detection from the combination of the reference voltage 103 and the first output voltage 102 to an input voltage 110 for non-use of the comparator when the output of the higher voltage side auxiliary comparator 107 is inactive, and a signal fixing circuit 115 fixing an output of the comparator 104 for detection to a constant voltage when the output of the higher voltage side auxiliary comparator 107 is inactive.

Then, the detailed configuration and operation of the power detector of FIG. 3 will be described.

The power voltage divider 101 divides the voltage of the power supply 100 using, for example, a resistor to generate the output voltage 102 to the comparator 104 for detection, and the output voltage 106 to the higher voltage side auxiliary comparator 107.

The comparator 104 for detection receives the output voltage 102 and the reference voltage 103 via the input switch 111, and compares the output voltage 102 to the reference voltage 103 as shown in FIG. 4A. As a result of the comparison, where the output voltage 102 is higher, the comparator 104 for detection activates its output 114.

The input switch 111 allows the output voltage 102 and the reference voltage 103 to be applied to the inputs of the comparator 104 for detection when the output of the higher voltage side auxiliary comparator 107 is active. The input switch 111 allows the input voltage 110 for non-use of the comparator to be applied to the inputs of the comparator 104 for detection when the input switching signal 113 is inactive.

With this operation of the input switch 111, different input voltages are applied to the two inputs of the comparator 104 for detection, only when the output of the higher voltage side auxiliary comparator 107 is active. In this state, the comparator 104 for detection activates its output 114 when the output voltage 102 is higher than the reference voltage 103 as shown in FIG. 4B.

When the output of the higher voltage side auxiliary comparator 107 is inactive, the input voltage 110 for non-use of the comparator is applied to both of the two inputs of the comparator 104 for detection. In this period, there is no difference in progress of BT degradation between the two inputs of the comparator 104 for detection. If there is no difference in progress of BT degradation between the two inputs, the difference in the amount of variations in the threshold voltage due to the BT degradation between the two inputs does not increase. This mitigates reduction in the accuracy of power detection caused by the BT degradation.

As shown in FIG. 4C, when the input switch 111 selects the input voltage 110 for non-use of the comparator, the signal fixing circuit 115 fixes the output of the comparator 104 for detection to the constant voltage. This prevents an indefinite state output from the comparator 104 for detection from being transmitted to the power detection signal 105.

As described above, according to this embodiment, the time when different input voltages are applied to the two inputs of the comparator 104 for detection is limited. This reduces reduction in the accuracy of power detection caused by BT degradation.

While in this embodiment, the output voltage 102 is selected when the output of the higher voltage side auxiliary comparator 107 is active, the output voltage 102 may be selected when the output of the higher voltage side auxiliary comparator 107 is inactive.

Third Embodiment

Figure 5:
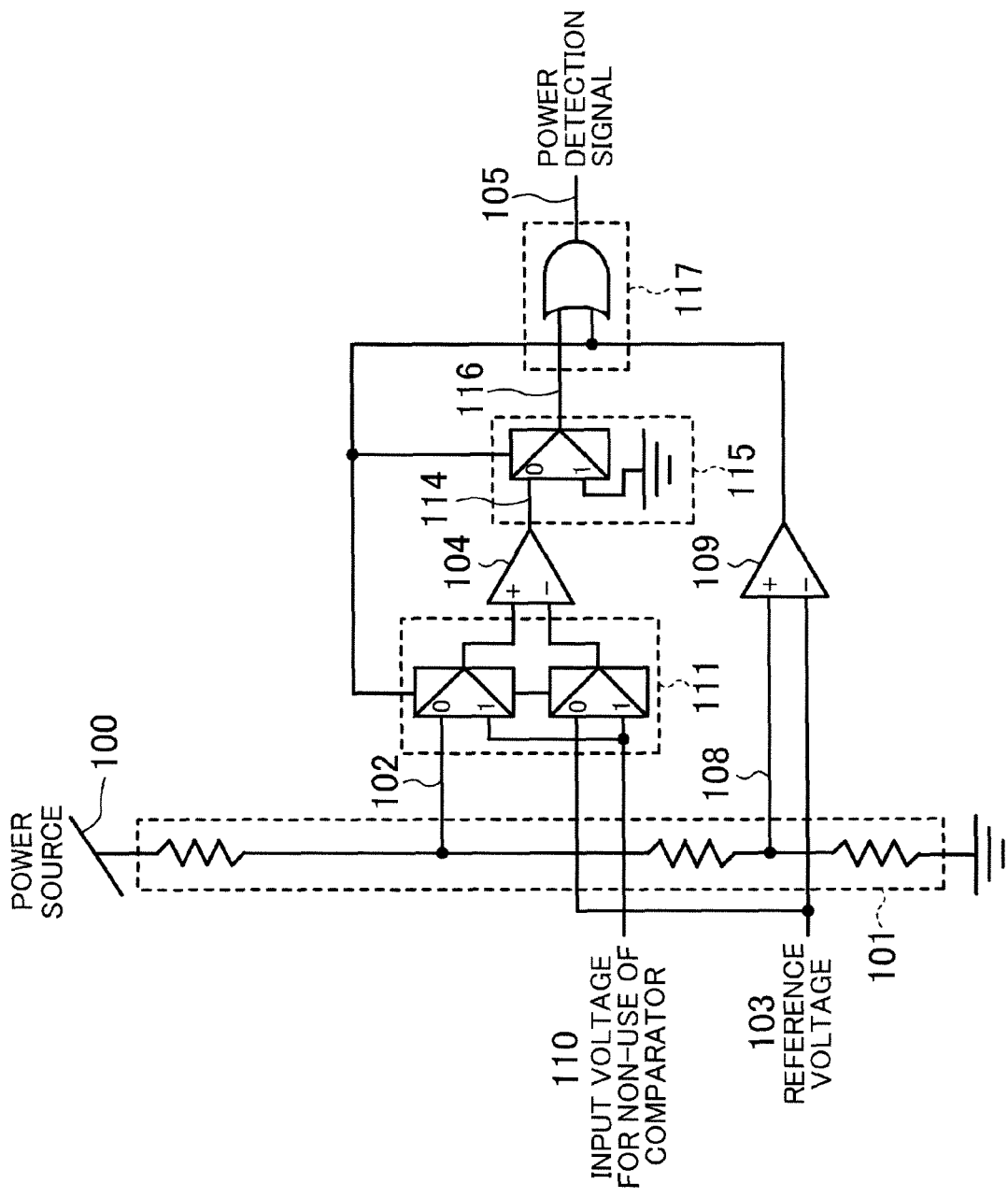
FIG. 5 illustrates a configuration of a power detector according to a third embodiment of the present disclosure.

FIG. 5 is a circuit diagram of a power detector according to this embodiment. FIGS. 6A-6D illustrate waveforms in the power detector.

In FIG. 5, the power detector includes a power voltage divider 101 dividing the voltage of the power supply 100, a comparator 104 for detection comparing a first output voltage 102 of the power voltage divider 101 to a reference voltage 103, and a lower voltage side auxiliary comparator 109 comparing a second output voltage 108 of the power voltage divider 101, which is lower than the first output voltage 102, to the reference voltage 103.

The power detector of FIG. 5 further includes an input switch 111 switching inputs of the comparator 104 for detection from the combination of the reference voltage 103 and the first output voltage 102 to an input voltage 110 for non-use of the comparator when an output of the lower voltage side auxiliary comparator 109 is active, a signal fixing circuit 115 fixing an output of the comparator 104 for detection to a constant voltage when the output of the lower voltage side auxiliary comparator 109 is active, and a power detection signal generator 117 generating a power detection signal 105 based on the output of the lower voltage side auxiliary comparator 109 and an output of the signal fixing circuit 115.

Then, the detailed configuration and operation of the power detector of FIG. 5 will be described.

The power voltage divider 101 divides the voltage of the power supply 100 using, for example, a resistor to generate the output voltage 102 to the comparator 104 for detection, and the output voltage 108 to the lower voltage side auxiliary comparator 109.

Figure 6:
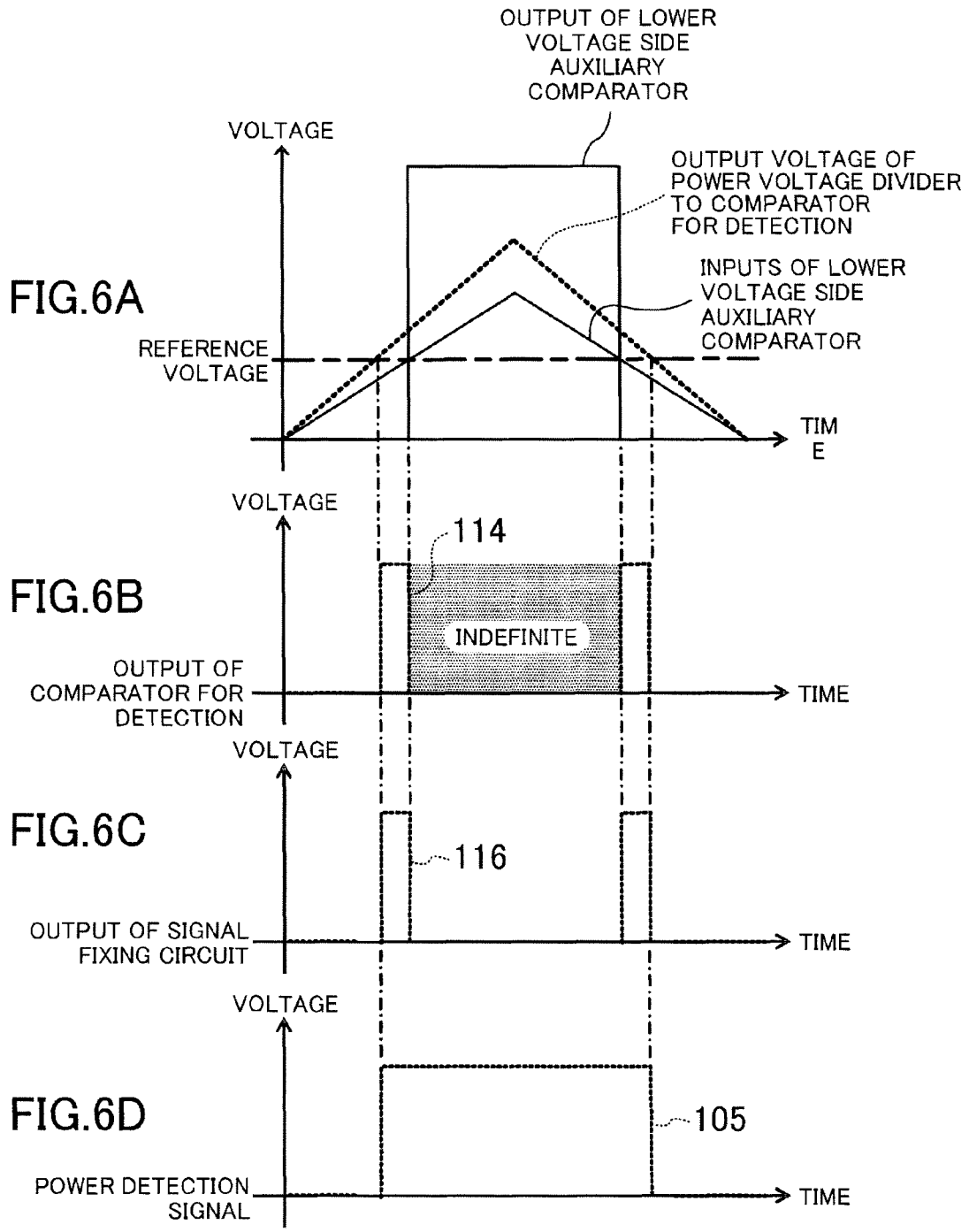
FIG. 6A illustrates a waveform of an output voltage of a power voltage divider to a comparator for detection, and waveforms of inputs and an output of a lower voltage side auxiliary comparator, in the third embodiment.
FIG. 6B illustrates a waveform of an output signal of the comparator for detection.
FIG. 6C illustrates a waveform of an output of a signal fixing circuit.
FIG. 6D illustrates a waveform of a power detection signal.

The comparator 104 for detection receives the output voltage 102 and the reference voltage 103 via the input switch 111, and compares the output voltage 102 to the reference voltage 103 as shown in FIG. 6A. As a result of the comparison, where the output voltage 102 is higher, the comparator 104 for detection activates the output 114.

The input switch 111 allows the output voltage 102 and the reference voltage 103 to be applied to the inputs of the comparator 104 for detection when the output of the lower voltage side auxiliary comparator 109 is inactive. The input switch 111 allows the input voltage 110 for non-use of the comparator to be applied to the inputs of the comparator 104 for detection when the output of the lower voltage side auxiliary comparator 109 is inactive.

With this operation of the input switch 111, different input voltages are applied to the two inputs of the comparator 104 for detection, only when the output of the lower voltage side auxiliary comparator 109 is inactive. In this state, the comparator 104 for detection activates its output 114 when the output voltage 102 is higher than the reference voltage 103 as shown in FIG. 6B.

When the output of the lower voltage side auxiliary comparator 109 is active, the input voltage 110 for non-use of the comparator is applied to both of the two inputs of the comparator 104 for detection. In this period, there is no difference in progress of BT degradation between the two inputs of the comparator 104 for detection. If there is no difference in progress of BT degradation between the two inputs, the difference in the amount of variations in the threshold voltage due to the BT degradation between the two inputs does not increase. This mitigates reduction in the accuracy of power detection caused by the BT degradation.

As shown in FIG. 6C, when the input switch 111 selects the input voltage 110 for non-use of the comparator, the signal fixing circuit 115 fixes the output of the comparator 104 for detection to the constant voltage (the ground voltage). This prevents an indefinite state output from the comparator 104 for detection from being transmitted to the power detection signal 105.

The power detection signal generator 117 performs OR operation of the output of the signal fixing circuit 115 and the output of the lower voltage side auxiliary comparator 109. As shown in FIG. 6D, when the output voltage 102 is higher than the reference voltage 103, the power detection signal 105 is always set high.

As described above, according to this embodiment, the time when different input voltages are applied to the two inputs of the comparator 104 for detection is limited. This reduces reduction in the accuracy of power detection caused by BT degradation.

While in this embodiment, the output voltage 102 is selected when the output of the lower voltage side auxiliary comparator 109 is inactive, the output voltage 102 may be selected when the output of the lower voltage side auxiliary comparator 109 is active.

Fourth Embodiment

With reduction in the areas of semiconductor devices in a single circuit, the accuracy of the semiconductor devices tends to decrease due to variations in a manufacturing process. However, in the power detectors according to the first to third embodiments, the accuracy of the power detection signal 105 depends on the comparison accuracy of the comparator 104 for detection. Thus, even if the comparison accuracy of the higher voltage side auxiliary comparator 107 or the lower voltage side auxiliary comparator 109 is lower than that of the comparator 104 for detection, this does not directly lead to reduction in the accuracy of the power detection signal 105.

Therefore, the circuit area can be reduced by setting the comparison accuracy of the higher voltage side auxiliary comparator 107 or the lower voltage side auxiliary comparator 109 to be lower than that of the comparator 104 for detection.

Variation

Figure 7:
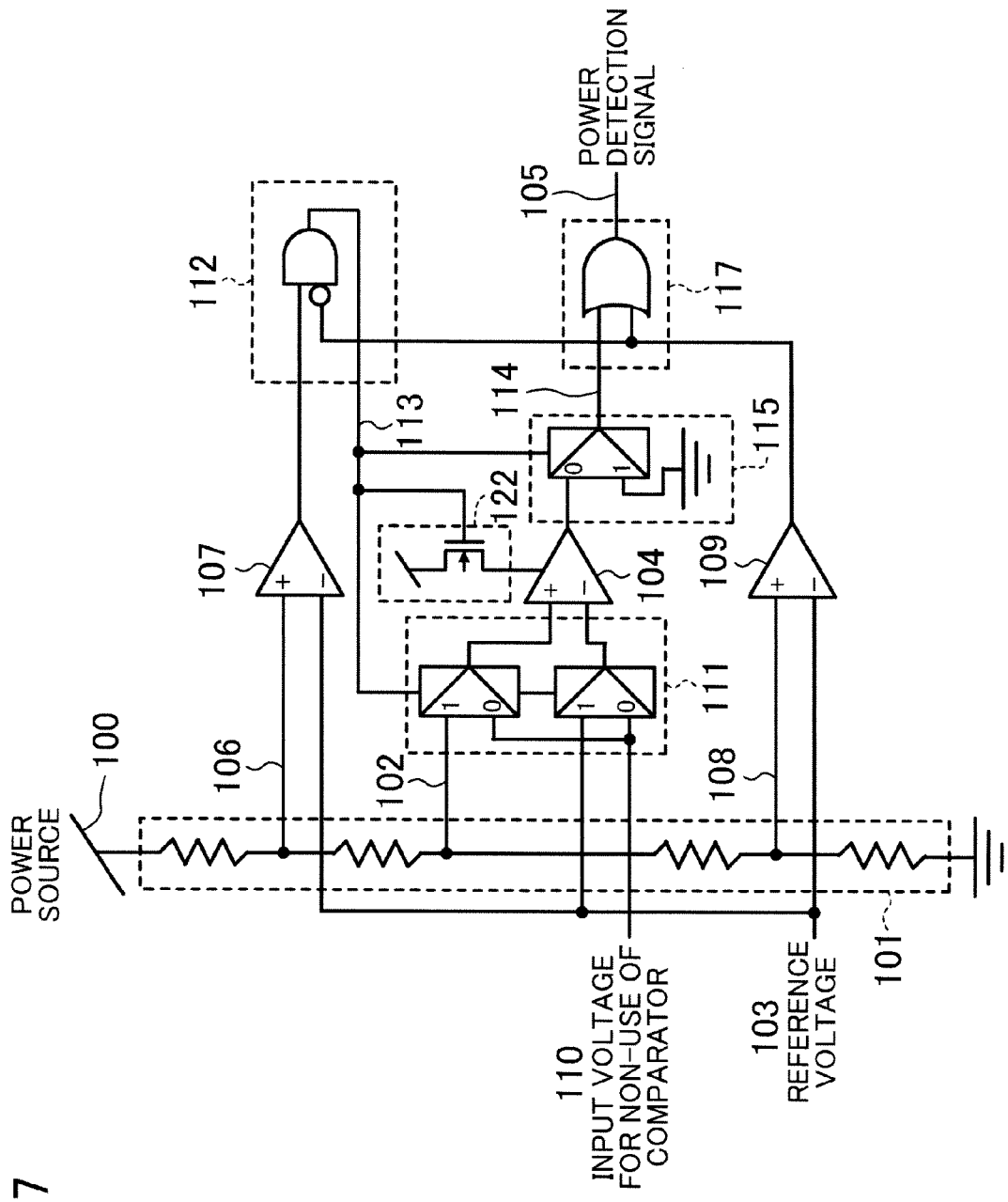
FIG. 7 illustrates a configuration of a power detector according to a variation of the first embodiment.
Figure 8:
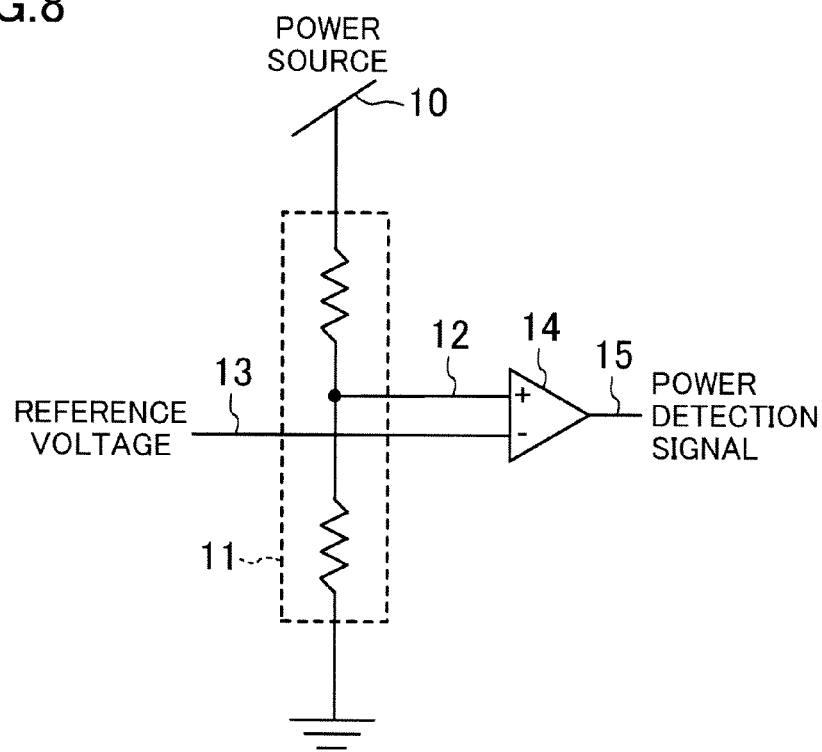
FIG. 8 illustrates an example configuration of a conventional power detector.
Figure 9:
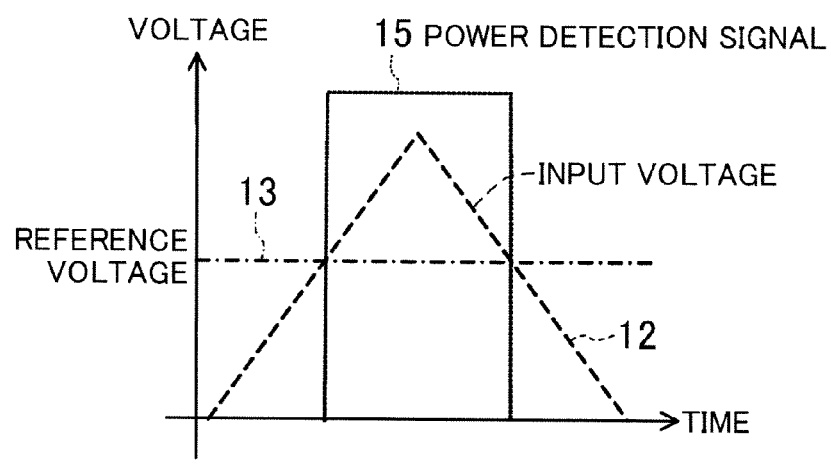
FIG. 9 illustrates a waveform of a power detection signal of the conventional power detector.
Figure 10:
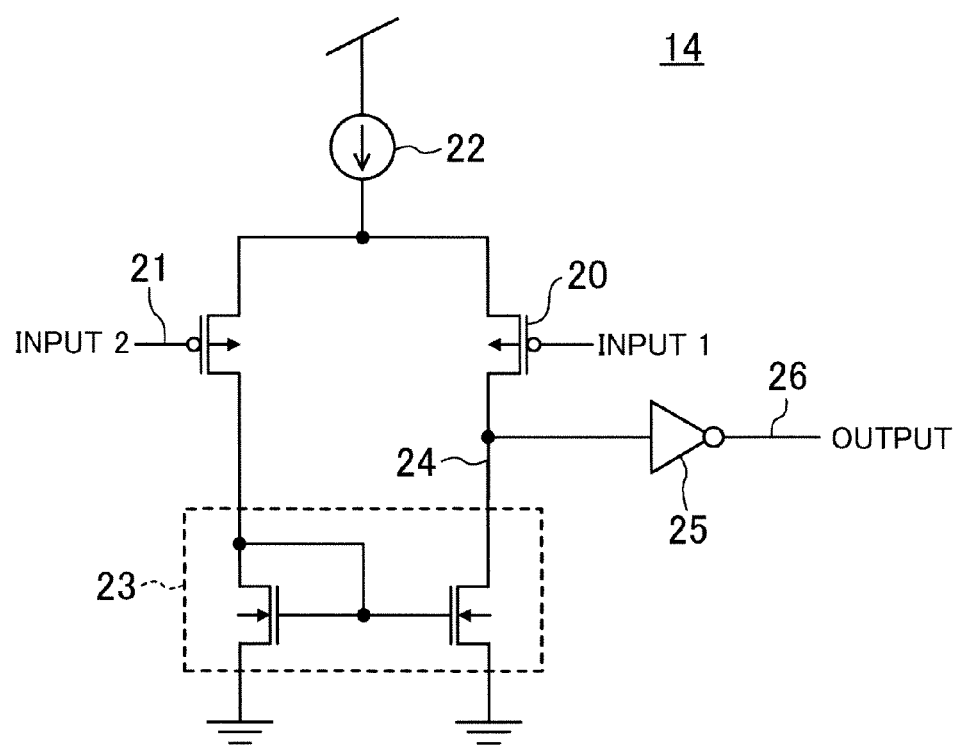
FIG. 10 illustrates a configuration of a comparator included in the conventional power detector.
Figure 11:
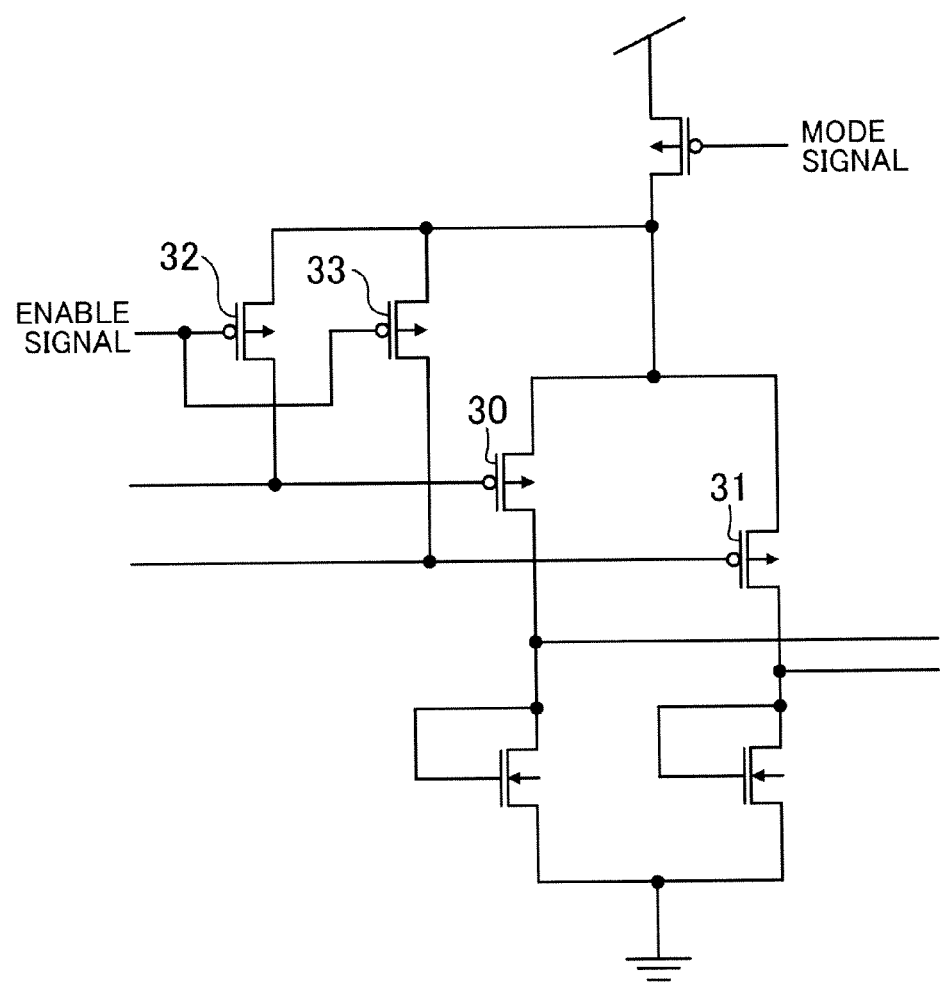
FIG. 11 illustrates a configuration of a circuit suggested in Japanese Patent Publication No. 2004-172796.

FIG. 7 is a circuit diagram of a power detector according to a variation of the first embodiment.

Different from the first embodiment, the power detector according to this variation includes a power breaker (a power breaking means) 122 breaking power of a comparator 104 for detection when an input switch 111 selects an input voltage 110 for non-use of the comparator as inputs of the comparator 104 for detection. With this configuration, no current flows to the comparator 104 for detection in this period.

By employing this configuration, the power consumption of the comparator 104 for detection can be reduced, while the input switch 111 selects the input voltage 110 for non-use of the comparator as the inputs of the comparator 104 for detection.

The present disclosure has been described by referring to the above-described embodiments and variation. However, such description of the embodiments should not be construed as limiting, and thus, various modifications can be made thereto, falling within the scope of the disclosure.

As described above, the power detector according to the present disclosure mitigates reduction in the accuracy of power detection caused by BT degradation, and is thus useful as a measure against the reduction in the accuracy of power detection of an electronic device using a battery, etc.

What is claimed is:
1. A power detector comprising:
a power voltage divider configured to divide a voltage of a power supply;
a comparator for detection configured to compare a first output voltage of the power voltage divider to a reference voltage;
a higher voltage side auxiliary comparator configured to compare a second output voltage of the power voltage divider, which is higher than the first output voltage, to the reference voltage;

a lower voltage side auxiliary comparator configured to compare a third output voltage of the power voltage divider, which is lower than the first output voltage, to the reference voltage;

an input switching signal generator configured to generate an input switching signal based on an output of the higher voltage side auxiliary comparator and an output of the lower voltage side auxiliary comparator;

an input switch configured to switch inputs of the comparator for detection from the reference voltage and the first output voltage to an input voltage for non-use of the comparator in accordance with the input switching signal;

a signal fixing unit configured to fix an output of the comparator for detection to a constant voltage when the input switch selects the input voltage for non-use of the comparator; and a power detection signal generator configured to generate a power detection signal based on the output of the lower voltage side auxiliary comparator and an output of the signal fixing unit.

2. A power detector comprising:

a power voltage divider configured to divide a voltage of a power supply;

a comparator for detection configured to compare a first output voltage of the power voltage divider to a reference voltage;

a higher voltage side auxiliary comparator configured to compare a second output voltage of the power voltage divider, which is higher than the first output voltage, to the reference voltage;

an input switch configured to switch inputs of the comparator for detection from the reference voltage and the first output voltage to an input voltage for non-use of the comparator in accordance with an output of the higher voltage side auxiliary comparator; and a signal fixing unit configured to fix an output of the comparator for detection to a constant voltage when the input switch selects the input voltage for non-use of the comparator.

3. The power detector of claim 2, wherein
the higher voltage side auxiliary comparator has lower comparison accuracy than the comparator for detection.

4. The power detector of claim 2, wherein
the signal fixing unit is a selector.

5. The power detector of claim 2, further comprising
a power breaker configured to break power of the comparator for detection when the input switch selects the input voltage for non-use of the comparator as the input of the comparator for detection.

6. A power detector comprising:

a power voltage divider configured to divide a voltage of a power supply;

a comparator for detection configured to compare a first output voltage of the power voltage divider to a reference voltage;

a lower voltage side auxiliary comparator configured to compare a second output voltage of the power voltage divider, which is lower than the first output voltage, to the reference voltage;

an input switch configured to switch inputs of the comparator for detection from the reference voltage and the first output voltage to an input voltage for non-use of the comparator in accordance with an output of the lower voltage side auxiliary comparator;

a signal fixing unit configured to fix an output of the comparator for detection to a constant voltage when the input switch selects the input voltage for non-use of the comparator; and a power detection signal generator configured to generate a power detection signal based on the output of the lower voltage side auxiliary comparator and an output of the signal fixing unit.

* * * * *